United States Patent

Capasso et al.

[11] Patent Number: 6,091,753
[45] Date of Patent: Jul. 18, 2000

[54] ARTICLE COMPRISING AN IMPROVED SUPERLATTICE QUANTUM CASCADE LASER

[75] Inventors: Federico Capasso, Westfield; Alfred Yi Cho, Summit, both of N.J.; Jerome Faist, Neuchatel, Switzerland; Claire F. Gmachl, Short Hills, N.J.; Albert Lee Hutchinson, Piscataway, N.J.; Deborah Lee Sivco, Warren, N.J.; Alessandro Tredicucci, Summit, N.J.

[73] Assignee: Lucent Technologies Inc., Murray Hill, N.J.

[21] Appl. No.: 09/071,219

[22] Filed: May 1, 1998

[51] Int. Cl.$^7$ ........................................................ H01S 3/19
[52] U.S. Cl. ................................ 372/45; 372/43; 372/44; 372/46; 372/96
[58] Field of Search ................................ 372/44, 45, 46, 372/43, 96

[56] References Cited

U.S. PATENT DOCUMENTS

| | | | |
|---|---|---|---|
| 5,457,709 | 10/1995 | Capasso et al. | 372/45 |
| 5,502,787 | 3/1996 | Capasso et al. | 385/123 |
| 5,509,025 | 4/1996 | Capasso et al. | 372/45 |
| 5,745,516 | 4/1998 | Capasso et al. | 372/45 |

FOREIGN PATENT DOCUMENTS 63182550  7/1988  Japan ............................ G01N 21/39

OTHER PUBLICATIONS

Treducucci et al., *Applied Physics Letters*, "High–Power Inter–Miniband Lasing in Intrinsic Superlattices", vol. 72, No. 19, pp. 2388–2390, May 11, 1998.

Scamarcio et al., *Science*, "High–Power Infrared (8–Micrometer Wavelength Superlattice Lasers", vol. 276, No. 5313, pp. 773–776, May 2, 1997.

"High Power Mid–Infrared (λ~5 μm) Quantum Cascade Lasers Operating Above Room Temperature", by J. Faist et a., *Applied Physics Letters*, vol. 68 (26), Jun. 24, 1996, pp. 3680–3682.

"High–Power Infrared (8–Micrometer Wavelength) Superlattice Lasers", by G. Scamarcio et al., *Science*, vol. 276, May 2, 1997, pp. 773–776.

Patent Application (Serial No. 08/74,292, filed Nov. 6, 1996) F. Capasso 44–75–8–12–1–9–13.

Patent Application (Serial No. 08/852,646, filed May 7, 1997) J. N. Baillargeon 4–45–77–9–1–10–14.

Primary Examiner—Robert H. Kim
Assistant Examiner—Gioacchino Inzirillo
Attorney, Agent, or Firm—Eugen A. Pacher

[57] ABSTRACT

A novel superlattice quantum cascade (SLQC) laser has undoped SL active regions, with the dopant concentration in the injector region being selected, such that, under an appropriate electrical bias, the SL active region is substantially electric field free. The absence of dopant atoms in the SL active region results in reduced carrier scattering and reduced optical losses, with consequent low threshold current and/or room temperature operation. The novel laser emits in the mid-IR spectral region and can be advantageously used in measurement or monitoring systems, e.g., in pollution monitoring systems.

8 Claims, 4 Drawing Sheets

ARTICLE COMPRISING AN IMPROVED SUPERLATTICE QUANTUM CASCADE LASER

GOVERNMENT CONTRACT

This invention was made with Government support under contract DAAH04-96-C-0026 with the Army Research Office. The Government has certain rights in this invention.

FIELD OF THE INVENTION

This application pertains to quantum cascade (QC) lasers, more specifically, to superlattice (SL) QC lasers.

BACKGROUND

Quantum cascade (QC) lasers are known. See, for instance, U.S. Pat. Nos. 5,457,709 and 5,509,025. See also J. Faist et al., *Applied Physics Letters*, Vol. 68, p. 3680 (1996), all incorporated herein by reference.

Briefly, a QC laser comprises a multiplicity of identical "repeat units". With each repeat unit is associated an upper and a lower energy level. Under an applied field, charge carriers (typically electrons) migrate from the lower energy level of a given repeat unit to the upper energy level of the adjacent downstream repeat unit, followed by a radiative transition from the upper to the lower level of the repeat unit, then proceeding into the next repeat unit. Thus, each charge carrier that is introduced into the active region of the QC laser ideally undergoes N transitions (N being the number of repeat units, about 25, for instance), each such transition resulting in emission of a photon of wavelength $\lambda$, typically in the midinfrared (exemplarily 3–13 $\mu$m).

U.S. patent application Ser. No. 08/744,292, by Capasso et al. (allowed), incorporated herein by reference, discloses a QC laser wherein a repeat unit comprises a superlattice active region and an injection/relaxation region. The superlattice region provides an upper and a lower miniband, with the radiative transition being from the upper to the lower miniband. After the radiative transition, the charge carrier migrates from the lower miniband through an injection/relaxation region to the upper miniband of the adjacent downstream repeat unit. See also G. Scamarcio et al., *Science*, Vol. 276, p. 773 (1997), also incorporated herein by reference.

SLQC (superlattice quantum cascade) lasers offer the advantage of wide energy minibands which potentially can carry large current densities without running into level misalignment when the applied voltage is increased. However, prior art SLQC lasers have relatively high optical losses, relatively broad emission linewidths, and reduced population inversion at high temperatures. As a consequence, prior art SLQC lasers typically present larger threshold current densities than standard QC lasers of the same wavelength, such that room temperature operation and/or continuous wave operation of prior art SLQC lasers typically is not possible.

In view of the potentially advantageous characteristics of SLQC lasers, it would be desirable to have available an improved SLQC laser that is substantially free of (or at least less subject to) the above recited shortcomings. This application discloses such an improved SLQC laser.

SUMMARY OF THE INVENTION

In a broad aspect the invention is embodied in a novel SLQC laser having features that result in reduced carrier scattering and reduced optical losses, with consequent low threshold current and/or room temperature operation.

More specifically, the invention is embodied in an article that comprises a SLQC laser that comprises, in sequence, an upper optical confinement region, a waveguide core region and a lower optical confinement region, and further comprises contacts for electrically contacting the laser. The waveguide core region comprises a multiplicity (typically 10 or more) of essentially identical repeat units, with a given repeat unit comprising an injection/relaxation region (herein to be referred to as an "injector" region), and a superlattice active region selected to facilitate radiative carrier transitions from an upper to a lower energy state of the superlattice active region. The injector region is selected to facilitate, under an appropriate electrical bias, charge carrier passage from the lower energy stage of a given superlattice active region to the upper energy state of the immediately adjacent downstream superlattice active region.

Significantly, the given superlattice active region is undoped (not intentionally doped), and at least a portion of the given injector region is doped (typically n-type), with the dopant concentration selected such that, under said electrical bias, the superlattice active region is substantially electric field free. The SL active region is "substantially electric field free" if the electron wavefunctions are not localized but instead extend over at least a substantial portion of the SL region. The existence or absence of localization can be readily determined from the energy spectrum of the levels. SLQC lasers according to the invention exemplarily can be used for pollution monitoring.

By an "undoped" or "not intentionally doped" semiconductor region, we mean herein a semiconductor region that contains less th about $10^{15}$ carriers/cm$^3$.

BRIEF DESCRIPTION OF THE DRAWINGS

The drawings are not intended to be to scale or in proportion. Same or closely similar features in different figures generally are designated by the same numeral.

DETAILED DESCRIPTION OF SOME EXAMPLARY EMBODIMENTS

Figure 1:
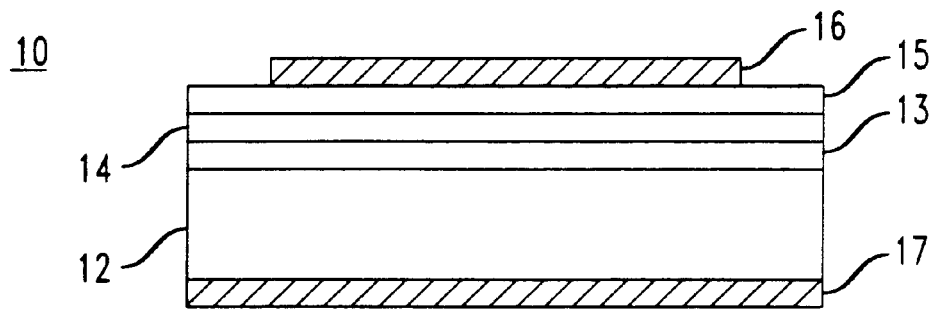
FIG. 1 schematically depicts an exemplary laser according to the invention.

FIG. 1 schematically depicts an exemplary laser 10 according to the invention, wherein numerals 16 and 17 refer to metal contacts, and numerals 12–15 refer, respectively, to the substrate/lower optical confinement region, waveguide core region, upper optical confinement region, and contact layer. It will be appreciated that at least the core region is a multilayer region. Upper and lower optical confinement region and waveguide core region frequently will be referred to as upper confinement region, lower confinement region and core region, respectively.

Table 1 shows the layer structure of an exemplary SLQC laser according to the invention. The layer structure was grown by MBE (molecular beam epitaxy), lattice matched to a doped (no~$10^{17}$ cm$^{-3}$) InP substrate. The substrate serves as the lower optical confinement region, but is not included in Table 1. See, for instance, U.S. Pat. No. 5,502,787. The upper optical confinement region comprises two AlInAs layers 1200 nm, $1.2\times10^{17}$ cm$^{-3}$ n-type; 1200 nm, $3\times10^{17}$ cm$^{-3}$ n-type) and an InGaAs plasmon waveguiding layer (500 nm, $8\times10^8$ cm$^{-3}$ n-type). InGaAs layers doped $6\times10^{16}$ cm$^{-3}$ (400 nm and 200 nm, respectively) below and above the 25 repeat units serve to increase the effective refractive index difference between the core region and the cladding regions. See, for instance, the above referenced '787 patent. The resulting confinement factor $\Gamma$ of the fundamental optical mode was computed to be 0.67 for the TM polarization required by the selection rules of the interminiband transitions.

The top layer (10 nm, $1\times10^{20}$ cm$^{-3}$) of the layer structure is a conventional contact layer. Other layers that are shown in Table 1 but are not discussed in detail serve known functions such as providing a graded transition between layers of different compositions.

For the sake of concreteness, the lower confinement region is considered to comprise the 25 nm digitally graded GaAlInAs layer, the core region is considered to extend from the 400 nm GaInAs layer to the 200 nm GaInAs layer, and the upper confinement layer comprises the remaining layers of Table 1.

Expressions such as GaInAs or AlInAs are not chemical formulae but only list the constituents. The layer structure of Table 1 was grown lattice matched to InP. Thus, InGaAs has composition $In_{0.53}Ga_{0.47}As$, and AlInAs has composition $Al_{0.48}In_{0.52}As$, as is known to those skilled in the art.

TABLE 1

| | | | |
|---|---|---|---|
| n++ | GaInAs (Sn) | $1 \times 10^{20}$ cm$^{-3}$ | 10 nm |
| n+ | GaInAs | $8 \times 10^{18}$ cm$^{-3}$ | 500 nm |
| n | $Ga_{0.5x}Al_{0.5(1-x)}$InAs $x = 0 \rightarrow 1$ (top) | $5 \times 10^{17}$ cm$^{-3}$ | 30 nm |
| n | AlInAs | $5 \times 10^{17}$ cm$^{-3}$ | 20 nm |
| n | AlInAs | $3 \times 10^{17}$ cm$^{-3}$ | 1200 nm |
| n | AlInAs | $1.2 \times 10^{17}$ cm$^{-3}$ | 1200 nm |
| n | $Ga_{0.5x}Al_{0.5(1-x)}$InAs $x = 1 \rightarrow 0$ (top) | $1.2 \times 10^{17}$ cm$^{-3}$ | 30 nm |
| n | GaInAs | $6 \times 10^{16}$ cm$^{-2}$ | 200 nm |
| undoped | AlInAs | | 2.4 nm |
| n | $Ga_{0.5x}Al_{0.5(1-x)}$InAs grading II | $3.5-5 \times 10^{17}$ cm$^{-3}$ | 38.4 nm repeat |
| undoped | active region | | 47.6 nm 25x |
| n | $Ga_{0.5x}Al_{0.5(1-x)}$InAs grading II | $3.5-5 \times 10^{17}$ cm$^{-3}$ | 38.4 nm |
| n | GaInAs | $6 \times 10^{16}$ cm$^{-3}$ | 400 nm |
| n | $Ga_{0.5x}Al_{0.5(1-x)}$InAs grading I | $1.2 \times 10^{17}$ cm$^{-3}$ | 25 nm |

The transition from the InP substrate to the 400 nm GaInAs layer is digitally graded (digital grading I). The details of digital grading I are shown in Table 2.

TABLE 2

| | | | |
|---|---|---|---|
| n | AlInAs | $1.2 \times 10^{17}$ cm$^{-3}$ | 0.5 nm |
| n | GaInAs | $1.2 \times 10^{17}$ cm$^{-3}$ | 4.5 nm |
| n | AlInAs | $1.2 \times 10^{17}$ cm$^{-3}$ | 1.0 nm |
| n | GaInAs | $1.2 \times 10^{17}$ cm$^{-3}$ | 4.0 nm |
| n | AlInAs | $1.2 \times 10^{17}$ cm$^{-3}$ | 1.5 nm |
| n | GaInAs | $1.2 \times 10^{17}$ cm$^{-3}$ | 3.5 nm |
| n | AlInAs | $1.2 \times 10^{17}$ cm$^{-3}$ | 2.0 nm |
| n | GaInAs | $1.2 \times 10^{17}$ cm$^{-3}$ | 3.0 nm |
| n | AlInAs | $1.2 \times 10^{17}$ cm$^{-3}$ | 2.5 nm |
| n | GaInAs | $1.2 \times 10^{17}$ cm$^{-3}$ | 2.5 nm |

The 400 nm GaInAs layer is followed by digital grading II, which in turn is followed by 25 repeat units consisting of alternating superlattice regions and injector regions, the latter being digital grading II. The details of digital grading II are given in Table 3. Layers designated "i" are undoped (not intentionally doped).

TABLE 3

| | | | |
|---|---|---|---|
| i | GaInAs | | 3.3 nm |
| i | AlInAs | | 1.7 nm |
| i | GaInAs | | 2.7 nm |
| i | AlInAs | | 2.0 nm |
| i | GaInAs | | 2.3 nm |
| i | AlInAs | | 2.3 nm |
| i | GaInAs | | 1.9 nm |
| i | AlInAs | | 2.7 nm |
| n | GaInAs | $3.5 \times 10^{17}$ cm$^{-3}$ | 1.6 nm |
| n | AlInAs | $4 \times 10^{17}$ cm$^{-3}$ | 3.1 nm |
| n | GaInAs | $4 \times 10^{17}$ cm$^{-3}$ | 1.4 nm |
| n | AlInAs | $4.5 \times 10^{17}$ cm$^{-3}$ | 3.4 nm |
| n | GaInAs | $4.5 \times 10^{17}$ cm$^{-3}$ | 1.2 nm |
| n | AlInAs | $5 \times 10^{17}$ cm$^{-3}$ | 3.7 nm |
| n | GaInAs | $5 \times 10^{17}$ cm$^{-3}$ | 1.1 nm |
| i | AlInAs | | 4.0 nm |

Table 4 shows the details of the superlattice active region which, together with an injector (see Table 3) forms a repeat unit. The exemplary layer structure of Table 1 has 25 repeat units, but could of course have more or fewer.

TABLE 4

| | | | |
|---|---|---|---|
| undoped | GaInAs | 4.6 nm | repeat |
| undoped | AlInAs | 1.2 nm | 7x |
| undoped | GaInAs | | 4.6 nm |
| undoped | AlInAs | | 2.4 nm |

A significant difference between the SLQC laser of the '292 patent application and the instant exemplary SLQC laser having the above disclosed layer structure is found in the dopant distribution. In the former the GaInAs/AlInAs superlattice active region is doped n-type (n=$1.0\times10^{17}$ cm$^{-3}$; see Table 1 and Table IV of '292), whereas in the latter the superlattice active region is undoped (not intentionally doped), with only the injector of any given repeat unit being doped. Indeed, typically only a part of the injector is doped, subject to a flat-field criterion that will be discussed below. This difference in doping results in reduced impurity scattering and reduced optical losses (such as free carrier absorption) in the SLQC laser according to the invention, as compared to prior art SLQC lasers, which is of operational significance.

The doping of the superlattice regions in prior art SLQC lasers is a necessary feature, required to maintain a flat superlattice band profile under external bias and to avoid breaking up of the minibands. On the other hand, we have now found that the SL active regions can be kept essentially field-free by using the charge distribution in the injectors to generate an electric field which compensates the applied field in the SL.

As is shown above, the layer structure of each repeat unit exemplarily comprises a 8 period superlattice active region with 4.6 nm thick $In_{0.53}Ga_{0.47}As$ wells and 1.2 nm thick $Al_{0.48}In_{0.52}As$ barriers, which gives a 166 meV wide minigap between the lowest energy level of the upper miniband and the top energy level of the lower miniband. This gap corresponds to a photon wavelength of about 7.5 $\mu$m. It will be appreciated that the wavelength can be changed by varying one or more SL parameters, e.g., well thickness and/or barrier thickness.

Figure 2:
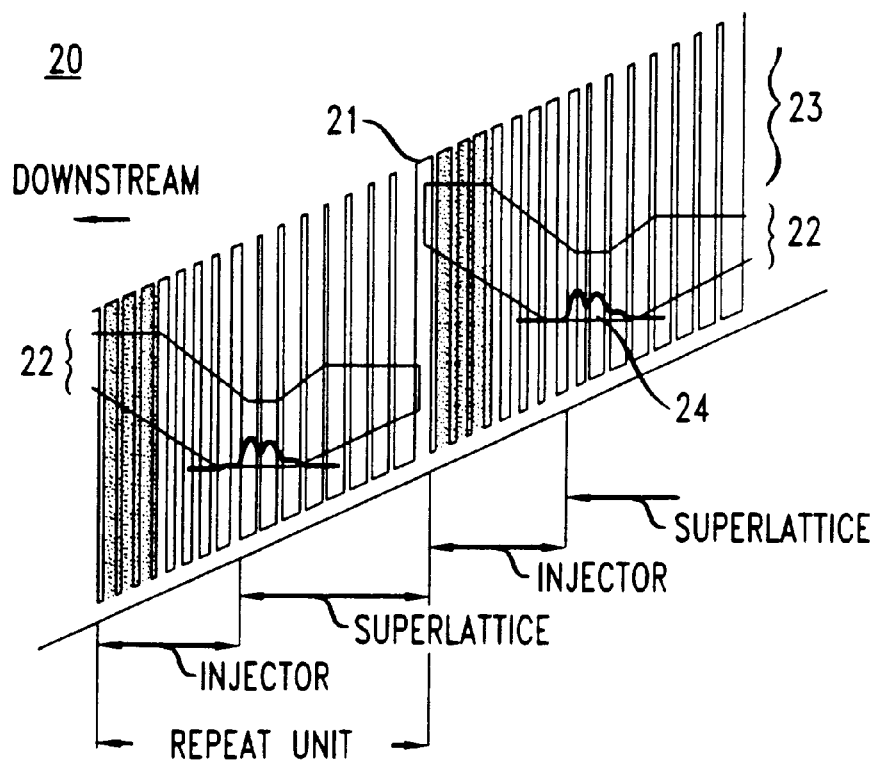
FIGS. 2 and 3 show a relevant portion of the conduction band edge of an exemplary laser according to the invention, assuming that all dopant atoms are unionized and ionized, respectively.

As is also shown above, each repeat unit also comprises a graded injector, with the injector layers closest to the adjacent downstream superlattice active region being doped, optionally with the dopant concentration graded, as shown in Table 3. The injector layer thicknesses are selected such that the ground state of the lowest resulting miniband is concentrated near the preceding superlattice. This is schematically illustrated in FIG. 2. The figure shows the conduction band edge of a portion 20 of the core region under a bias field of 29 kV/cm, indicating the superlattice active region and the injector region, as well as the repeat unit. For the sake of concreteness, the repeat unit is considered to extend from injection barrier 21 to the quantum well just ahead of the next downstream injection barrier. Other bounds for the repeat unit could of course also be used. Numeral 22 refers to the lowest miniband, 23 to the minigap just above the miniband, and 24 to the electron wavefunction in the ground state of the miniband. The downstream direction is also indicated. The shaded portion of the injector region is doped, the remainder of the repeat unit is undoped. FIG. 2 is to be understood to pertain to the (fictitious) situation wherein all dopant atoms are un-ionized, i.e., there are no free electrons in the repeat structure.

Figure 3:
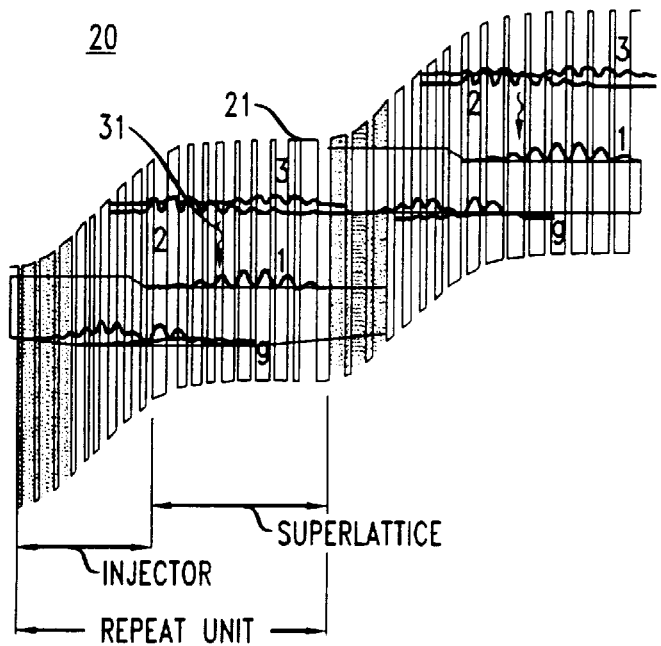

Assuming that in each repeat unit the electrons start filling the miniband from its groundstate up to the quasi-Fermi level determined by the amount of doping, one can compute the actual band profile of the structure, taking into account self-consistently the field generated by the extrinsic charges through a Poisson-Schroedinger iterative procedure, as will be understood by those skilled in the art. The results of this computation are shown in FIG. 3, wherein "g" refers to the ground state of one repeat unit, numeral 1 refers to the upper extended electron wavefunctions of the lowest miniband, and numerals 2 and 3 refer to the lower extended electron wavefunctions of the upper miniband. Wavy arrow 31 shows the minigap where laser action takes place. The bandstructure was calculated for an applied field of 29 kV/cm.

As can be seen from FIG. 3, the SL regions are substantially field-free, with the first miniband of a given repeat unit closely aligned with the second miniband of the next (downstream) repeat unit. This insures efficient carrier injection into the lasing states of the SLQC laser.

After completion of the MBE growth of the lattice matched layer structure on a n-type InP wafer, lasers were formed by conventional mesa etching through the active region into stripes of various widths, deposition of a silicon nitride insulator layer and metallization, followed by cleaving into bars 1.5–3 mm long, with the facets left uncoated. The thus formed devices were soldered to copper plates, wire bonded, and mounted in a He-flow cryostat for measurements.

Figure 4:
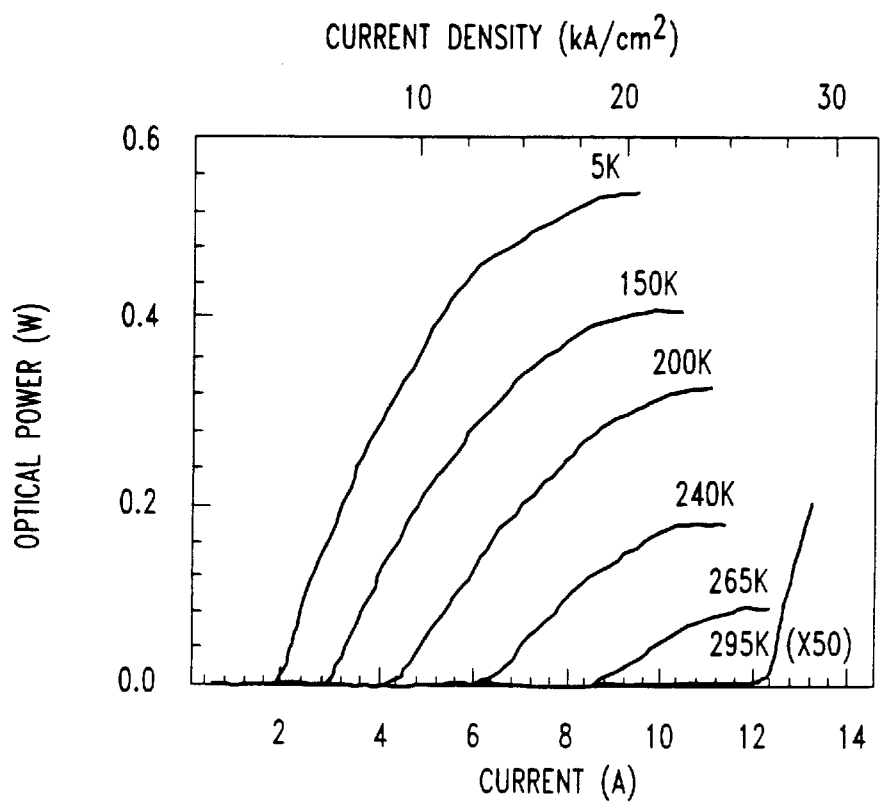
FIGS. 4–7 show experimental data from an exemplary laser according to the invention.

The lasers were driven by 50 ns current pulses at a repetition rate of approximately 5 kHz, and the light output from a single facet was collected (collection efficiency~50%) with f/0.8 optics onto a fast calibrated room-temperature HgCdTe detector. The light-current characteristics recorded from a 15 $\mu$m wide, 3 mm long stripe are plotted in FIG. 4. At 5 K a maximum collected power of~550 mW was obtained, with a current density at the lasing threshold of 4.2 kA/cm$^2$, considerably better than results obtained by us with prior art SLQC lasers of comparable wavelength.

The lasers according to the invention could also be operated at room temperature, with a few mW of putput power. This constitutes a significant improvement over results obtained with prior art SLQC lasers, which exemplarily had a maximum operating temperature of 240 K. Over the temperature range 160–280 K the measured threshold current density of the SLQC of FIG. 4 could be fit with an expression proportional to exp (T/T$_o$), where T is the absolute measurement temperature, and T$_o$ is 101 K, a high value characteristic of intersubband QC lasers.

Figure 5:
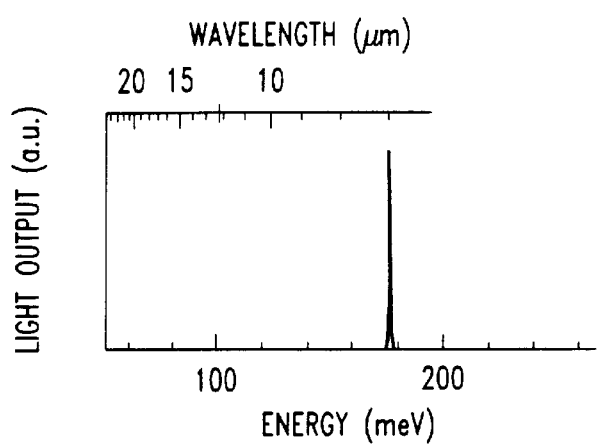
Figure 6:
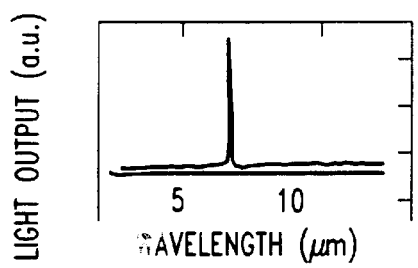

FIG. 5 shows the spectrum of the pulsed emission of the SLQC laser of FIG. 3 at low temperature. The laser wavelength is about 7 $\mu$m, somewhat less than the expected wavelength of 7.5 $\mu$m. This discrepancy is, we believe, due to a departure of the SL band structure from ideal flatness, and can be substantially eliminated, as will be described below. FIG. 6 shows the pulsed light output of the laser of FIG. 3 at room temperature.

Figure 7:
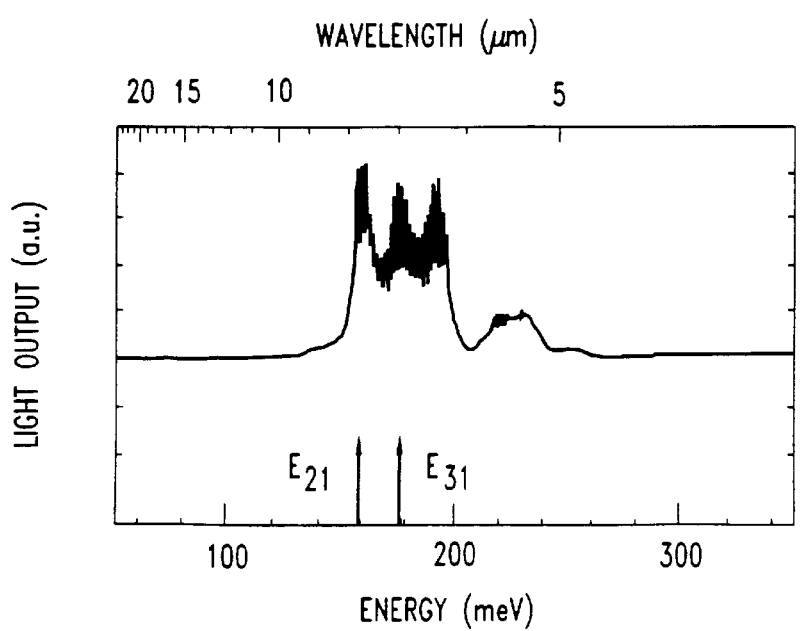

FIG. 7 shows the low temperature continuous wave sub-threshold spectrum of a 1.5 mm long stripe of the above-described layer structure, at a current density of 2.4 kA/cm$^2$. The fast oscillations superimposed on the main peaks are Fabry-Perot fringes. Their high contrast is a clear manifestation of gain. The two arrows indicate the calculated energy positions of transitions 3→1 and 2→1, as shown in FIG. 3.

Table 5 shows the layer structure of an exemplary improved SLQC laser according to the invention. Comparison with Table 1 shows that in the core region the two structures differ primarily substantially only with regard to the doping levels of some layers, and with regard to thickness of some of the layers.

TABLE 5

| | | | |
|---|---|---|---|
| n$^{++}$ | GaInAs (Sn) | $1 \times 10^{20}$ cm$^{-3}$ | 10 nm |
| n$^{30}$ | GaInAs | $7 \times 10^{18}$ cm$^{-3}$ | 500 nm |
| n | Ga$_{0.5x}$Al$_{0.5(1-x)}$InAs grading IV | $5 \times 10^{17}$ cm$^{-3}$ | 29.4 nm |
| n | AlInAs | $5 \times 10^{17}$ cm$^{-3}$ | 10 nm |
| n | AlInAs | $2 \times 10^{17}$ cm$^{-3}$ | 1200 nm |
| n | AlInAs | $1 \times 10^{17}$ cm$^{-3}$ | 1200 nm |
| n | Ga$_{0.5x}$Al$_{0.5(1-x)}$InAs grading III | $1 \times 10^{17}$ cm$^{-3}$ | 29.4 nm |
| n | GaInAs | $5 \times 10^{16}$ cm$^{-2}$ | 220 nm |
| undoped | AlInAs | | 2 nm |
| n | Ga$_{0.5x}$Al$_{0.5(1-x)}$InAs grading II | $5 \times 10^{17}$ cm$^{-3}$ | 43.3 nm repeat |
| undoped | active region | | 44 nm 25× |
| n | Ga$_{0.5x}$Al$_{0.5(1-x)}$InAs grading II | $5 \times 10^{17}$ cm$^{-3}$ | 43.3 nm |
| n | GaInAs | $5 \times 10^{16}$ cm$^{-3}$ | 400 nm |
| n | Ga$_{0.5x}$Al$_{0.5(1-x)}$InAs grading I | $1 \times 10^{17}$ cm$^{-3}$ | 25 nm |

Digital Grading I of the improved structure is identical to that of Table 2, except that in the former the doping level is 1×10$^{17}$/cm$^3$ for all layers.

Table 6 shows digital grading II of the improved structure. Comparison with Table 3 shows small differences in layer thicknesses and doping levels, as well as in the number of well/barrier pairs.

TABLE 6

| | | | |
|---|---|---|---|
| i | GaInAs | | 3.5 nm |
| i | AlInAs | | 1.7 nm |
| i | GaInAs | | 3.0 nm |
| i | AlInAs | | 1.8 nm |
| i | GaInAs | | 2.6 nm |
| i | AlInAs | | 2.0 nm |
| i | GaInAs | | 2.2 nm |
| i | AlInAs | | 2.3 nm |
| i | GaInAs | | 1.8 nm |
| i | AlInAs | | 2.7 nm |
| n | GaInAs | $5 \times 10^{17}$ cm$^{-3}$ | 1.6 nm |
| n | AlInAs | $5 \times 10^{17}$ cm$^{-3}$ | 3.1 nm |
| n | GaInAs | $5 \times 10^{17}$ cm$^{-3}$ | 1.4 nm |

TABLE 6-continued

| n | AlInAs | $5 \times 10^{17}$ cm$^{-3}$ | 3.4 nm |
|---|--------|------------------------------|--------|
| n | GaInAs | $5 \times 10^{17}$ cm$^{-3}$ | 1.3 nm |
| n | AlInAs | $5 \times 10^{17}$ cm$^{-3}$ | 3.7 nm |
| n | GaInAs | $5 \times 10^{17}$ cm$^{-3}$ | 1.2 nm |
| i | AlInAs |                              | 4.0 nm |

Table 7 shows the layer structure of the active region of the exemplary improved SLQC. Comparison with Table 4 shows differences in layer thicknesses as well as in the number of layers, including the number of well/barrier pairs in the SL.

TABLE 7

| undoped | GaInAs |        | 4.4    |
|---------|--------|--------|--------|
| undoped | AlInAs |        | 1.0    |
| undoped | GaInAs | 4.6 nm | repeat |
| undoped | AlInAs | 1.0 nm | 5×     |
| undoped | GaInAs |        | 4.0    |
| undoped | AlInAs |        | 1.0    |
| undoped | GaInAs |        | 3.6    |
| undoped | AlInAs |        | 2.0    |

Figure 8:
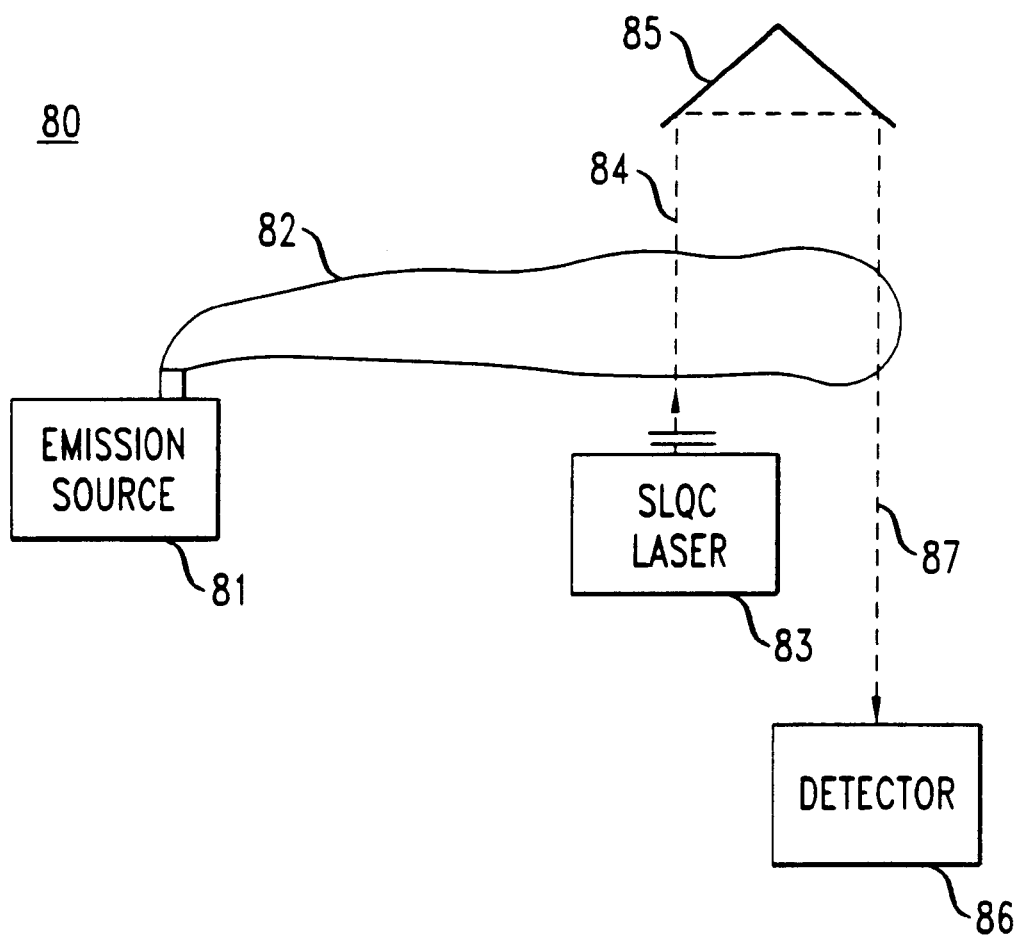
FIG. 8 schematically depicts an exemplary article according to the invention, namely, a pollution monitoring system.

Lasers according to the invention (optionally comprising a grating structure for providing feedback) exemplarily can be advantageously used as sources of mid-IR radiation in measurement or monitoring systems, for instance, in pollution monitoring systems, and FIG. 8 schematically depicts an exemplary pollution monitoring system 80 according to the invention. Further detail can be found in U.S. patent application Ser. No. 08/852,646, filed May 7, 1997 by J. N. Baillargeon et al., incorporated herein by reference.

The layer structure of the improved SLQC laser according to the invention was designed so as to compensate for the (practically unavoidable) non-ideal flatness of the SL layers (thereby recovering the large oscillator strength at the minigap), and so as to yield an energy difference between the first two energy states of the upper miniband that is approximately equal to the energy of one optical phonon, whereby population inversion is improved.

The above described improved SLQC laser had peak power of about 700 mW at low temperature (e.g., 6K), and about 175 mW at 298K. The laser wavelength was about 8 μm.

In FIG. 8, reference numeral 81 refers to an emission source (e.g., a factory) that emits gaseous emission cloud 82. SLQC laser according to the invention 83 emits mid-IR radiation 84 which propagates through the emission cloud and is reflected (e.g., by means of a corner reflector 85). Reflected radiation 87 then is detected by means of conventional detector 86.

The laser can be pumped in any appropriate manner, and the detector output can be utilized in any appropriate manner. A mirror or other appropriate reflector can be used instead of the corner reflector. The reflector can be on an aircraft or any elevated feature, including the smoke stack that is being monitored. Of course, the detector could also be on an aircraft, or be on an elevated feature. In general, any arrangement that results in a line-of-sight disposition of laser and detector is contemplated.

The invention claimed is:

1. Article comprising a quantum cascade laser comprising, in sequence, an upper optical confinement region, a waveguide core region and a lower optical confinement region, and further comprising contacts for electrically contacting the laser; said waveguide core region comprising a multiplicity of essentially identical repeat units, a given repeat unit comprising an injector region and a superlattice active region selected to facilitate radiative carrier transition from an upper to a lower energy state of the superlattice active region; said injector region selected to facilitate, under appropriate electrical bias, charge carrier passage from the lower energy state of a given superlattice active region to the upper energy state of the immediately adjacent downstream superlattice active region;

CHARACTERIZED IN THAT a) said given superlattice active region is not intentionally doped;

b) at least a portion of said given injector region is doped n-type, with a dopant concentration selected such that, under said electrical bias, the superlattice active region is substantially electric field free.

2. Article according to claim 1, wherein said radiative carrier transition results in emission of a photon of wavelength in the wavelength range 3–13 μm.

3. Article according to claim 1, wherein said optical core region comprises 10 or more repeat units.

4. Article according to claim 1, wherein said superlattice active region comprises alternating layers of GaInAs and AlInAs.

5. Article according to claim 1, wherein only a portion of said injector region is doped n-type, with the remainder of the injector region being not intentionally doped.

6. Article according to claim 1, wherein said not intentionally doped superlattice active region contains fewer than $10^{15}$ dopant atoms/cm$^3$.

7. Article according to claim 1, wherein the article is a measurement system for measuring infrared radiation absorption by a measurement species, wherein the measurement system comprises a source of infrared laser radiation comprising a) the quantum cascade laser of claim 1; and the measurement system further comprises b) a detector for detecting the infrared laser radiation after passage thereof through a quantity of said measurement species.

8. Article according to claim 7, wherein the laser comprises a grating structure.

* * * * *